US010636809B2

(12) United States Patent
Nakatsuka

(10) Patent No.: US 10,636,809 B2
(45) Date of Patent: Apr. 28, 2020

(54) SEMICONDUCTOR MEMORY DEVICE

(71) Applicant: Toshiba Memory Corporation, Tokyo (JP)

(72) Inventor: Keisuke Nakatsuka, Kobe Hyogo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/126,259

(22) Filed: Sep. 10, 2018

(65) Prior Publication Data

US 2019/0267392 A1    Aug. 29, 2019

(30) Foreign Application Priority Data

Feb. 28, 2018    (JP) ................. 2018-035548

(51) Int. Cl.
*H01L 29/76* (2006.01)
*H01L 27/11582* (2017.01)
*H01L 29/51* (2006.01)

(52) U.S. Cl.
CPC ...... *H01L 27/11582* (2013.01); *H01L 29/513* (2013.01); *H01L 29/517* (2013.01); *H01L 29/518* (2013.01)

(58) Field of Classification Search
CPC ......... H01L 27/11582; H01L 27/11556; H01L 27/11524; H01L 27/11565; H01L 29/40117; H01L 29/40114; H01L 29/78; H01L 29/4234; H01L 27/1052; H01L 29/495; H01L 29/511; H01L 29/51; H01L 29/401

USPC ......................................................... 257/314
See application file for complete search history.

(56) References Cited

U.S. PATENT DOCUMENTS

| 9,837,435 | B1 | 12/2017 | Chang et al. |
| 2014/0159137 | A1 | 6/2014 | Yun et al. |
| 2015/0263126 | A1 | 9/2015 | Shingu |
| 2015/0364485 | A1* | 12/2015 | Shimura ........... H01L 27/11556 257/316 |
| 2016/0079256 | A1 | 3/2016 | Inaba |
| 2016/0260732 | A1 | 9/2016 | Lue |

FOREIGN PATENT DOCUMENTS

| JP | 2013-069953 A | 4/2013 |
| TW | 201633510 A | 9/2016 |
| TW | I605575 B | 11/2017 |

* cited by examiner

*Primary Examiner* — Theresa T Doan
(74) *Attorney, Agent, or Firm* — Foley & Lardner LLP

(57) ABSTRACT

A semiconductor memory device includes a plurality of electrode films and a plurality of first insulating films stacked alternately along a first direction, a semiconductor member extending in the first direction, a charge storage member provided between the semiconductor member and the electrode films, and a second insulating film provided between the charge storage member and the electrode films. At least one of the plurality of first insulating films includes one or more types of a first material selected from the group consisting of silicon nitride, hafnium oxide, silicon oxynitride, and aluminum oxide.

19 Claims, 17 Drawing Sheets

SEMICONDUCTOR MEMORY DEVICE

CROSS-REFERENCE TO RELATED APPLICATION

This application is based upon and claims the benefit of priority from Japanese Patent Application No. 2018-035548, filed on Feb. 28, 2018; the entire contents of which are incorporated herein by reference.

FIELD

Embodiments described herein relate generally to a semiconductor memory device.

BACKGROUND

Conventionally, higher capacity of a two-dimensional semiconductor memory device has been realized by downscaling the circuit. However, because downscaling technology is approaching a limit, a three-dimensional semiconductor memory device is being developed to realize even higher capacity. In the three-dimensional semiconductor memory device, a stacked body in which multiple electrode films are stacked is provided on a substrate; multiple semiconductor members that pierce the stacked body are provided; and memory cell transistors are formed at the crossing portions between the electrode films and the semiconductor members. The stability of the operations of the memory cell transistors is problematic in such a three-dimensional semiconductor memory device.

DETAILED DESCRIPTION

According to one embodiment, a semiconductor memory device includes a plurality of electrode films and a plurality of first insulating films stacked alternately along a first direction, a semiconductor member extending in the first direction, a charge storage member provided between the semiconductor member and the electrode films, and a second insulating film provided between the charge storage member and the electrode films. At least one of the plurality of first insulating films includes one or more types of a first material selected from the group consisting of silicon nitride, hafnium oxide, silicon oxynitride, and aluminum oxide.

First Embodiment

A first embodiment will now be described.

Figure 1:
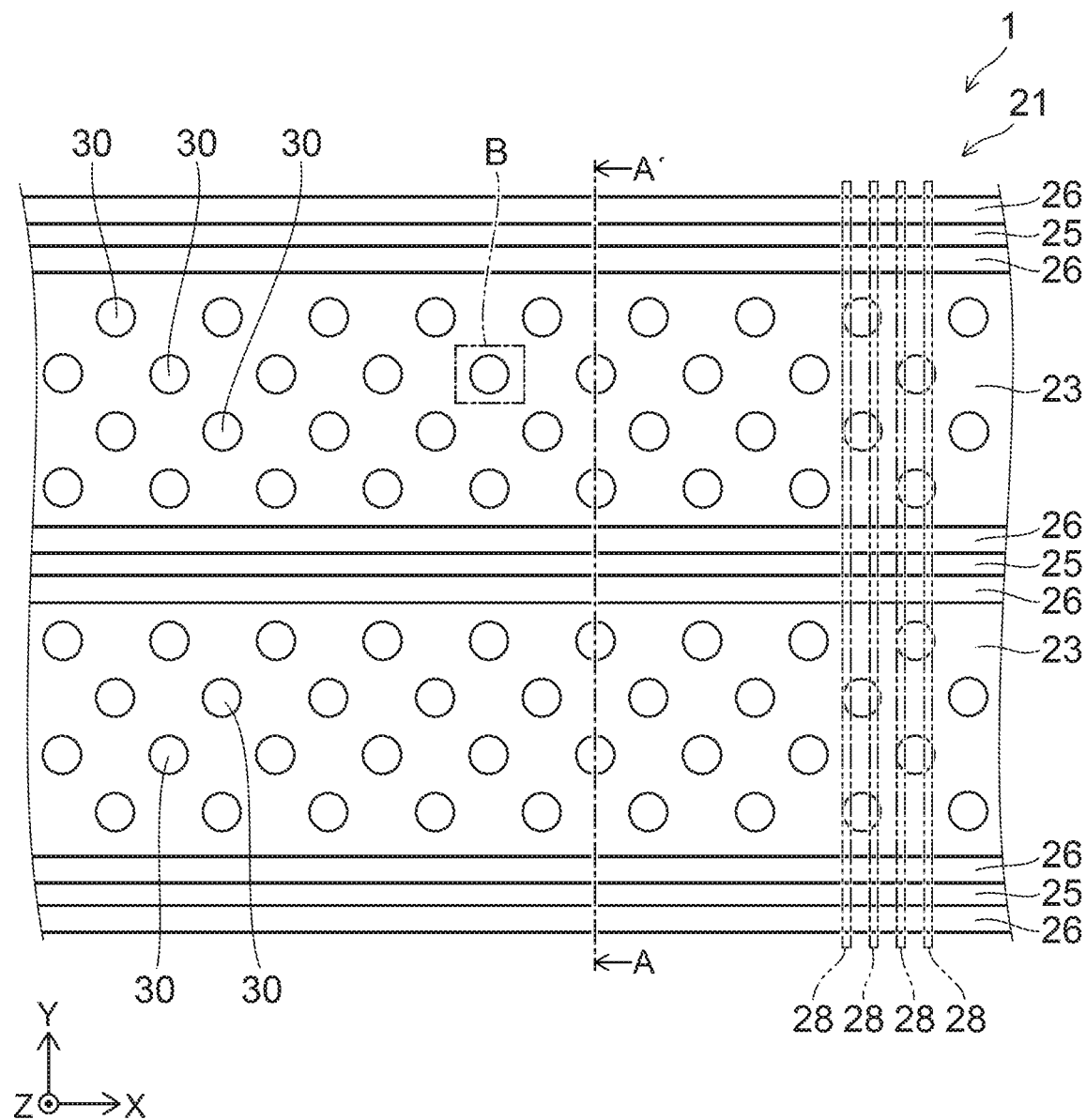
FIG. 1 is a plan view showing a semiconductor memory device according to a first embodiment.

FIG. 1 is a plan view showing a semiconductor memory device according to the embodiment.

Figure 2:
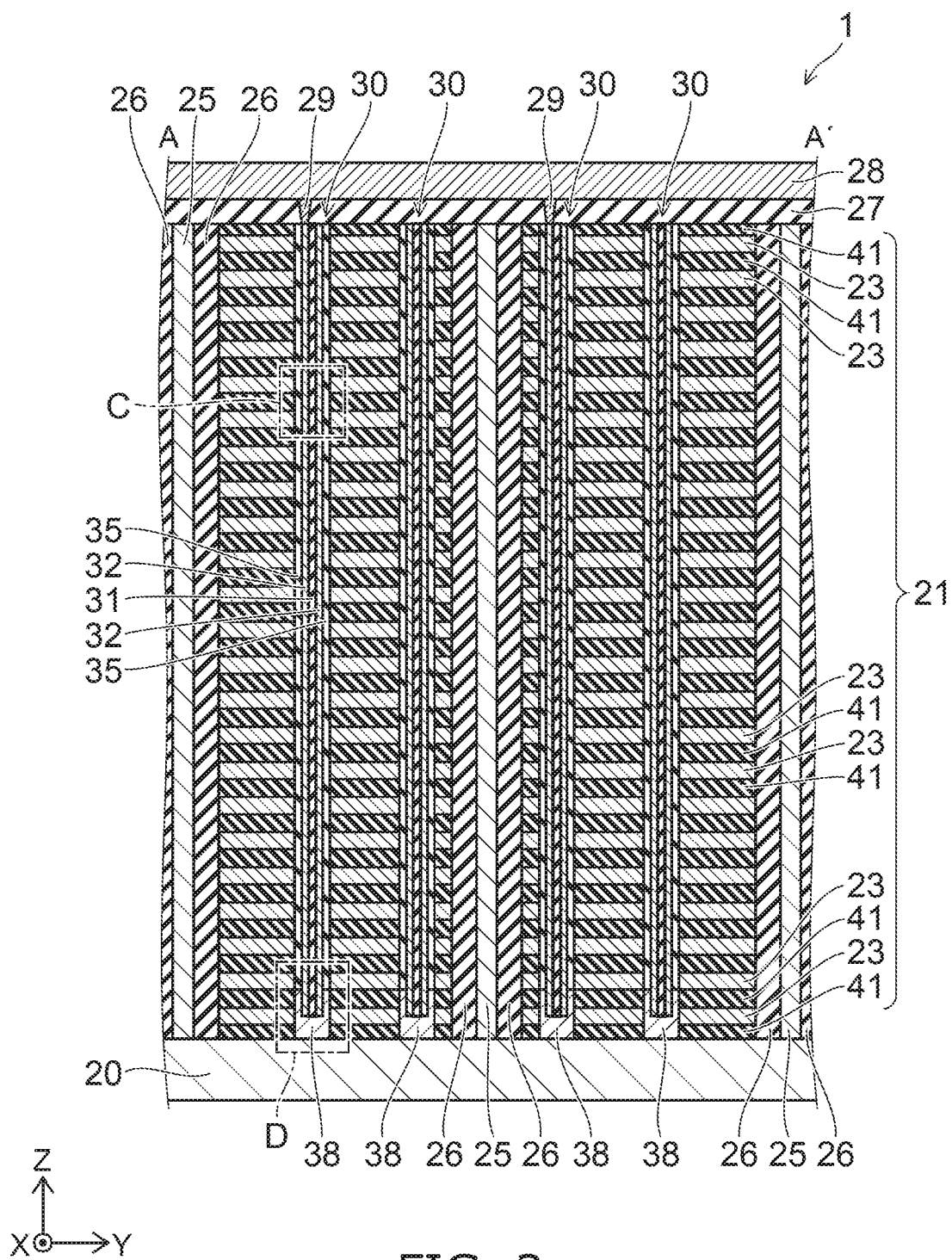
FIG. 2 is a cross-sectional view along line A-A' shown in FIG. 1.

FIG. 2 is a cross-sectional view along line A-A' shown in FIG. 1.

Figure 3:
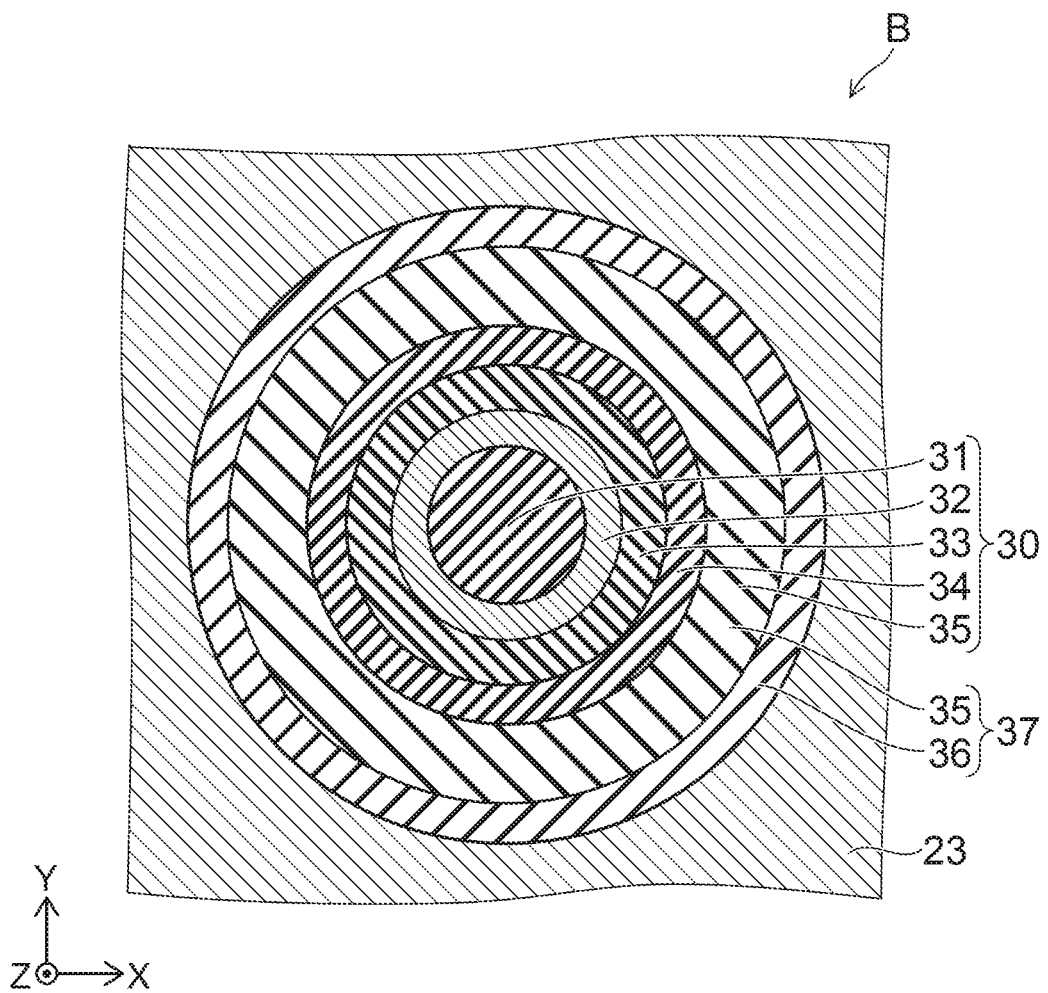
FIG. 3 is a cross-sectional view corresponding to region B of FIG. 1.

FIG. 3 is a cross-sectional view corresponding to region B of FIG. 1.

Figure 4:
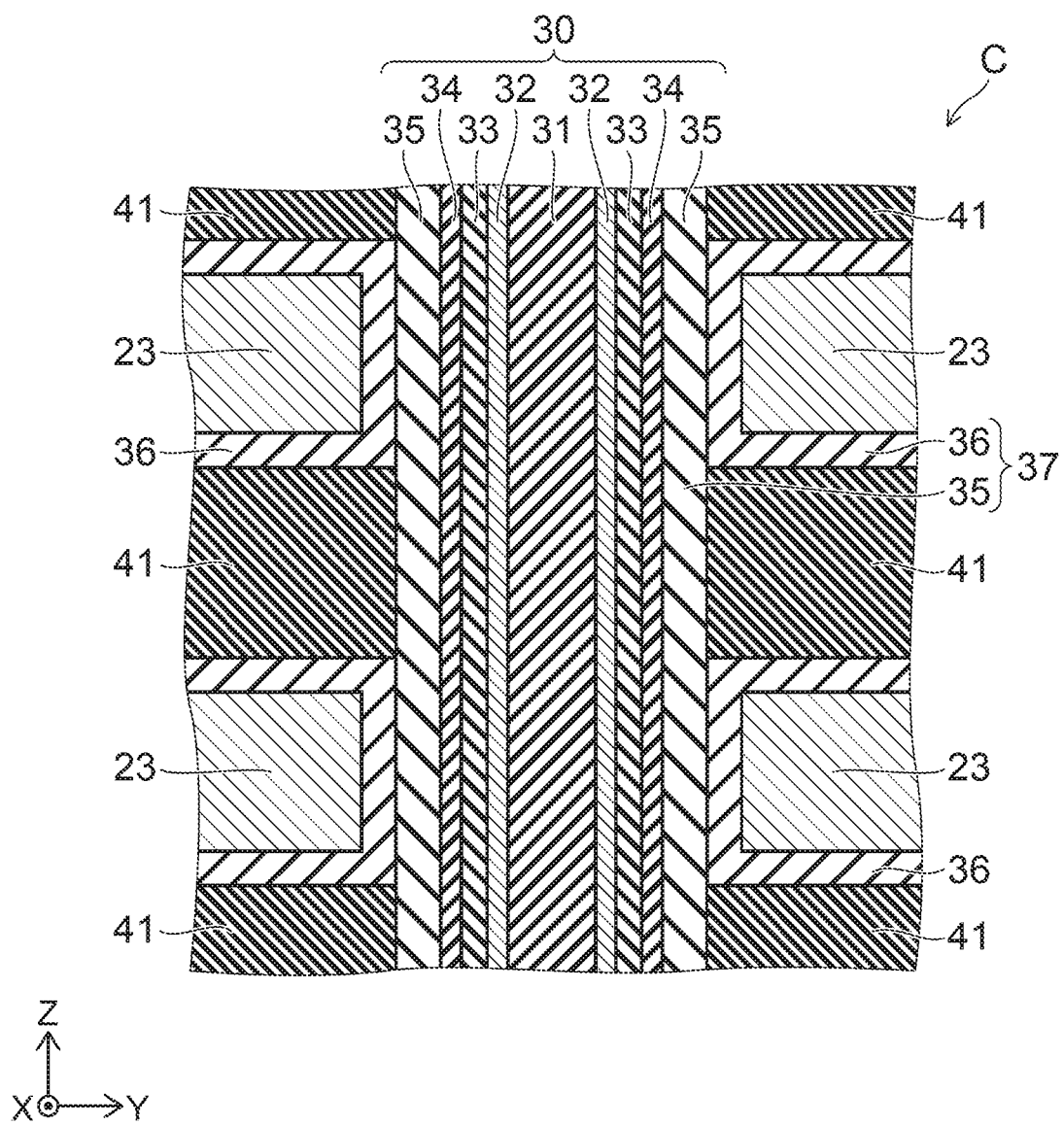
FIG. 4 is a cross-sectional view corresponding to region C of FIG. 2.

FIG. 4 is a cross-sectional view corresponding to region C of FIG. 2.

Figure 5:
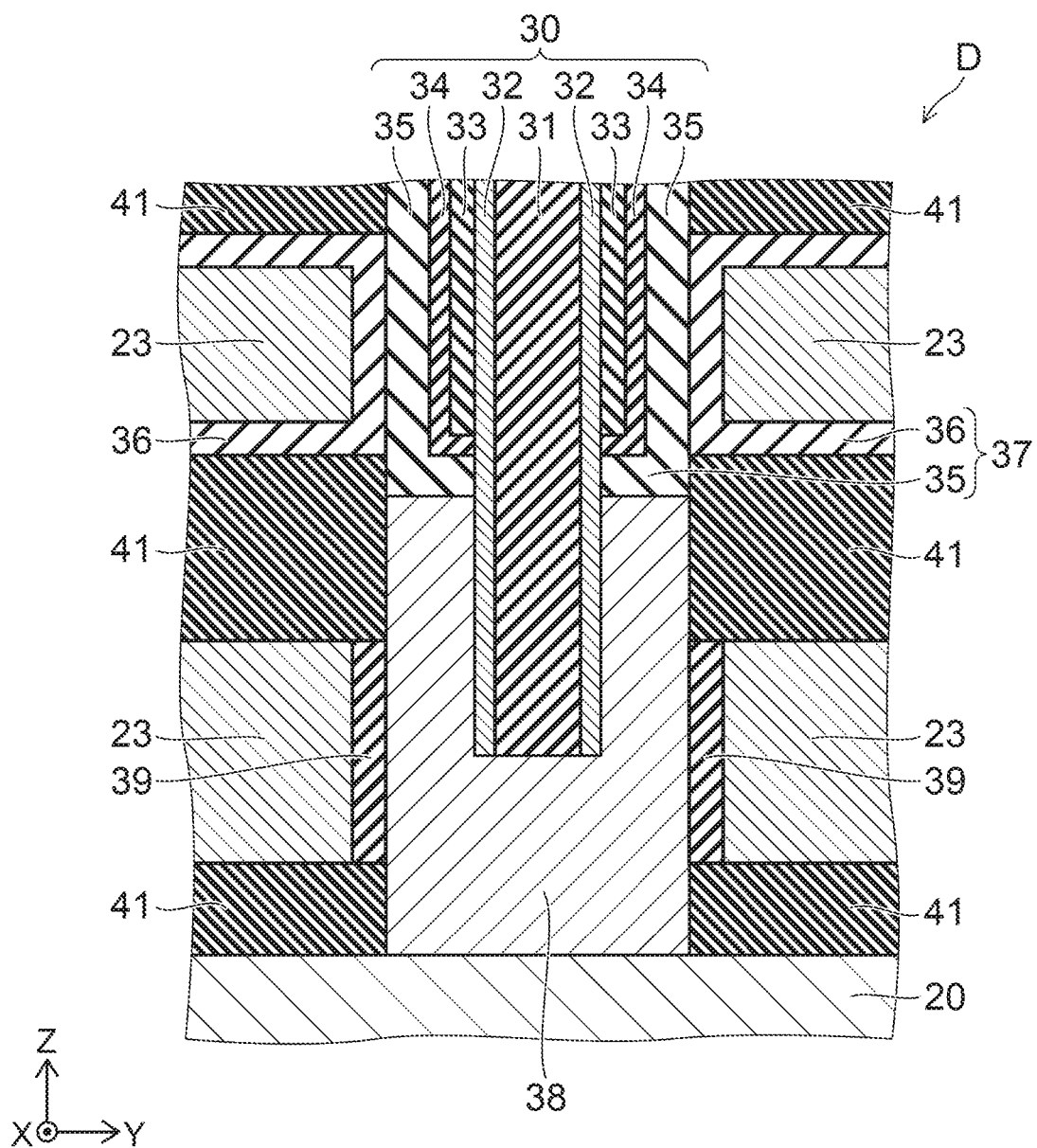
FIG. 5 is a cross-sectional view corresponding to region D of FIG. 2.

FIG. 5 is a cross-sectional view corresponding to region D of FIG. 2.

The drawings are schematic and are drawn with appropriate exaggerations or omissions. For example, the components are drawn to be larger and fewer than the actual components. The numbers, dimensional ratios, etc., of the components do not always match between the drawings. This is similar for the drawings described below as well.

The semiconductor memory device according to the embodiment is three-dimensional NAND flash memory.

As shown in FIG. 1 and FIG. 2, a silicon substrate 20 is provided in the semiconductor memory device 1 according to the embodiment (hereinbelow, also called simply the "device 1"). For example, the silicon substrate 20 is formed of a single crystal of silicon (Si). A stacked body 21 is provided on the silicon substrate 20.

In the specification hereinbelow, an XYZ orthogonal coordinate system is employed for convenience of description. The arrangement direction of the silicon substrate 20 and the stacked body 21 is taken as a "Z-direction." Although a direction that is in the Z-direction from the silicon substrate 20 toward the stacked body 21 also is called "up" and the reverse direction also is called "down," these expressions are for convenience and are independent of the direction of gravity. Two mutually-orthogonal directions orthogonal to the Z-direction are taken as an "X-direction" and a "Y-direction."

Fixed charge retaining films 41 and electrode films 23 are stacked alternately along the Z-direction in the stacked body 21. The electrode films 23 are made from a conductive material and include, for example, tungsten (W). For example, a barrier metal layer (not illustrated) in which a titanium layer and a titanium nitride layer are stacked may be provided at a portion of the surfaces of the electrode films 23. The configurations of the two X-direction end portions of the stacked body 21 (not illustrated) are staircase configurations in which a terrace is formed every electrode film 23.

The fixed charge retaining film 41 is insulative and includes a fixed charge retaining material. In the specification, "fixed charge retaining material" refers to a material in which a positive or negative charge can be retained stably. There are multiple types of fixed charge retaining materials; and the polarity of the charge that can be retained is different between process factors such as the film formation conditions, etc., even for the same composition. Examples of fixed charge retaining materials are shown in Table 1 recited below.

TABLE 1

| Polarity of fixed charge | Material | Composition example | Film formation condition |
|---|---|---|---|
| Positive | Carbon-containing silicon oxide | $SiO_5 + C$ | Heat treatment at or below 500 °C. |
| Positive | Silicon nitride | $Si_3N_4$ | Nitrided silicon |
| Positive | Hafnium oxide | $HfO_2$ | |
| Negative | Silicon oxynitride | SiON | Nitrided silicon oxide |
| Negative | Silicon nitride | $Si_3N_4$ | Deposition |
| Negative | Aluminum oxide | $Al_2O_3$ | |
| Negative | Hafnium oxide | $HfO_2$ | |
| Negative | Carbon-containing silicon oxide | $SiO_2 + C$ | Heat treatment at or above 700 °C. |

As shown in Table 1, for example, carbon-containing silicon oxide having heat treatment at a temperature of 500° C. or less, silicon nitride formed by nitriding silicon, and hafnium oxide are materials that can retain a positive fixed charge. On the other hand, for example, silicon oxynitride formed by nitriding silicon oxide, silicon nitride formed by deposition, aluminum oxide, hafnium oxide, and carbon-containing silicon oxide having heat treatment at a temperature of 700° C. or more are materials that can retain a negative fixed charge. Although hafnium oxide can retain either a positive or negative fixed charge, the polarity of the retained fixed charge is dependent on multiple factors. It is sufficient for the fixed charge retaining film 41 to include one or more types of materials of the fixed charge retaining materials shown in Table 1. For example, the entire fixed charge retaining film 41 may be formed of a fixed charge retaining material shown in Table 1; or a fixed charge retaining material shown in Table 1 may be diffused or dispersed in a main material made of silicon oxide, etc. This is similar for the fixed charge retaining films and the fixed charge retaining members of the other embodiments described below as well.

As described above, the fixed charge retaining film 41 includes at least one type of material selected from the group consisting of carbon-containing silicon oxide, silicon nitride, hafnium oxide, silicon oxynitride, and aluminum oxide. In the embodiment, for example, the fixed charge retaining film 41 is formed of carbon-containing silicon oxide and retains a negative fixed charge.

For example, the fixed charge retaining films 41 may be formed by depositing the fixed charge retaining material described above in a process of forming the stacked body 21 by alternately depositing the fixed charge retaining films 41 and silicon nitride films (not illustrated) on the silicon substrate 20. Or, the prescribed material may be added while depositing silicon oxide (SiO) as the main material. The silicon nitride films that are inside the stacked body 21 are replaced with the electrode films 23 in a subsequent process.

A conductive plate 25 that has a plate configuration spreading along the XZ plane is provided inside the stacked body 21. The conductive plate 25 pierces the stacked body 21 in the X-direction and the Z-direction; and the lower end of the conductive plate 25 is connected to the silicon substrate 20. The conductive plate 25 is formed of a conductive material and is formed of, for example, at least one of tungsten or silicon. For example, the conductive plates 25 are arranged at uniform spacing along the Y-direction.

Insulating plates 26 are provided on the two Y-direction sides of each of the conductive plates 25. For example, the insulating plates 26 are formed of an insulating material such as silicon oxide, etc. The conductive plate 25 is insulated from the electrode films 23 by the insulating plates 26. Each of the electrode films 23 is divided into multiple portions in the Y-direction by a structure body made of one conductive plate 25 and two insulating plates 26 on the two sides of the one conductive plate 25. Each portion of the divided electrode film 23 is an interconnect extending in the X-direction. A member "extending in the X-direction" means that the length in the X-direction of the member is longer than the length in the Y-direction and the length in the Z-direction. This is similar also for cases extending in the Y-direction and extending in the Z-direction. The stacked body that is made of the fixed charge retaining films 41 and the electrode films 23 is disposed in each region between the structure bodies made of the one conductive plate 25 and the two insulating plates 26 on the two sides of the one conductive plate 25. In other words, the multiple electrode films 23 that are arranged to be separated from each other along the Z-direction are provided in one stacked body. Also, when viewed from the one stacked body, an adjacent stacked body is disposed on the Y-direction side.

A columnar member 30 that extends in the Z-direction is multiply provided in the portion of the stacked body 21 interposed between the conductive plates 25. The configuration of the columnar member 30 is a substantially columnar configuration having a central axis extending in the Z-direction and is, for example, a substantially circular columnar configuration, a substantially elliptical columnar configuration, or a substantially quadrilateral prism configuration. In the drawings and the description hereinbelow, the case is illustrated where the configuration of the columnar member 30 is a circular columnar configuration. When viewed from the Z-direction, for example, the columnar members 30 are arranged in a staggered configuration.

An insulating film 27 is provided on the stacked body 21; and bit lines 28 that extend in the Y-direction are provided on the insulating film 27. Plugs 29 are provided inside the insulating film 27. The insulating film 27 also covers the end portions (not illustrated) having the staircase configurations of the stacked body 21 and is disposed also at the sides of the stacked body 21, that is, on the X-direction side and the Y-direction side.

As shown in FIG. 3 and FIG. 4, a core member 31 is provided in the columnar member 30. The core member 31 is formed of an insulating material and is formed of, for example, silicon oxide. The configuration of the core member 31 is a substantially circular column having a central axis extending in the Z-direction. A silicon pillar 32 is provided at the periphery of the core member 31. The silicon pillar 32 is formed of silicon which is a semiconductor material. The configuration of the silicon pillar 32 is a substantially circular tube having a central axis extending in the Z-direction. The upper end of the silicon pillar 32 is connected to the bit line 28 (referring to FIG. 2) via the plug 29 (referring to FIG. 2).

A tunneling insulating film 33, a charge storage film 34, and a silicon oxide film 35 are stacked in this order from the silicon pillar 32 side toward the outer side of the columnar member 30 at the periphery of the silicon pillar 32. The silicon oxide film 35 contacts the charge storage film 34. The configurations of the tunneling insulating film 33, the charge storage film 34, and the silicon oxide film 35 are substantially circular tubes having central axes extending in the Z-direction.

Although the tunneling insulating film 33 normally is insulative, the tunneling insulating film 33 is a film in which a tunneling current flows when a prescribed voltage within the range of the drive voltage of the device 1 is applied and is, for example, an ONO film in which a silicon oxide layer, a silicon nitride layer, and a silicon oxide layer are stacked in this order. The charge storage film 34 is a film that can store charge, is formed of, for example, an insulating material having trap sites of electrons, and is made of, for example, silicon nitride (SiN). The silicon oxide film 35 is made of silicon oxide.

A high dielectric constant film 36 is provided at the periphery of the columnar member 30. The high dielectric constant film 36 is formed of a high dielectric constant material having a higher dielectric constant than silicon oxide and is formed of, for example, aluminum oxide or hafnium oxide. The high dielectric constant film 36 is provided on the upper surface of the electrode film 23, on the lower surface of the electrode film 23, and on the side surface of the electrode film 23 facing the columnar member 30 and is not provided on the side surface of the electrode film 23 facing the insulating plate 26. The high dielectric constant film 36 contacts the silicon oxide film 35, the electrode films 23, and the fixed charge retaining films 41. A blocking insulating film 37 is formed of the silicon oxide film 35 and the high dielectric constant film 36. The blocking insulating film 37 is a film in which a current substantially does not flow even when a voltage within the range of the drive voltage of the device 1 is applied.

As shown in FIG. 2 and FIG. 5, a silicon member 38 is provided between the silicon substrate 20 and the columnar member 30. The silicon member 38 is formed by epitaxial growth of silicon from the silicon substrate 20. The structure body that is made of the columnar member 30 and the silicon member 38 pierces the stacked body 21 in the Z-direction. The lower end of the silicon pillar 32 is connected to the silicon substrate 20 via the silicon member 38.

The silicon member 38 pierces the electrode film 23 of the lowermost layer and the fixed charge retaining films 41 above and below the electrode film 23 of the lowermost layer. An insulating film 39 that is made of, for example, silicon oxide is provided between the silicon member 38 and the electrode film 23. The silicon member 38 is insulated from the electrode film 23 by the insulating film 39. The core member 31 and the silicon pillar 32 of the columnar member 30 enter the silicon member 38 from above. On the other hand, the tunneling insulating film 33, the charge storage film 34, and the silicon oxide film 35 do not enter the silicon member 38.

In the stacked body 21, one or multiple electrode films 23 from the top function as an upper select gate line; and an upper select gate transistor is configured at each crossing portion between the upper select gate line and the silicon pillars 32. Also, one or multiple electrode films 23 from the bottom, e.g., the electrode film 23 of the lowermost level, functions as a lower select gate line; and a lower select gate transistor is configured at each crossing portion between the lower select gate line and the silicon members 38. The electrode films 23 other than the upper select gate line and the lower select gate line function as word lines; and a memory cell transistor is configured at each crossing portion between the word lines and the silicon pillars 32. The silicon pillar 32 functions as channels of the memory cell transistors; and the electrode films 23 function as gates of the memory cell transistors. Thereby, a NAND string is formed by the multiple memory cell transistors being connected in series along each of the silicon pillars 32 and by the upper select gate transistor and the lower select gate transistor being connected at the two ends of the multiple memory cell transistors.

Effects of the embodiment will now be described.

In the semiconductor memory device 1 according to the embodiment, the fixed charge retaining films 41 are provided as insulating films between the electrode films 23 adjacent to each other in the Z-direction. Thereby, for example, a negative fixed charge is retained by the fixed charge retaining films 41; and in the case where a positive potential is applied to the electrode film 23 of one memory cell transistor, the effects on another memory cell transistor adjacent to the one memory cell transistor in the Z-direction can be reduced. As a result, the interference between the memory cell transistors can be suppressed; and the independence of the operations of the memory cell transistors can be improved.

On the other hand, for example, in the case where a positive fixed charge is retained by the fixed charge retaining films 41, the portions of the silicon pillar 32 surrounded with the fixed charge retaining films 41 can be set to the ON state regardless of the potentials of the proximal electrode films 23. As a result, the current that flows through the silicon pillar 32 can be increased. Thus, the stability of the operations of the memory cell transistors is increased by providing the fixed charge retaining films 41 between the electrode films 23.

Second Embodiment

A second embodiment will now be described.

Figure 6:
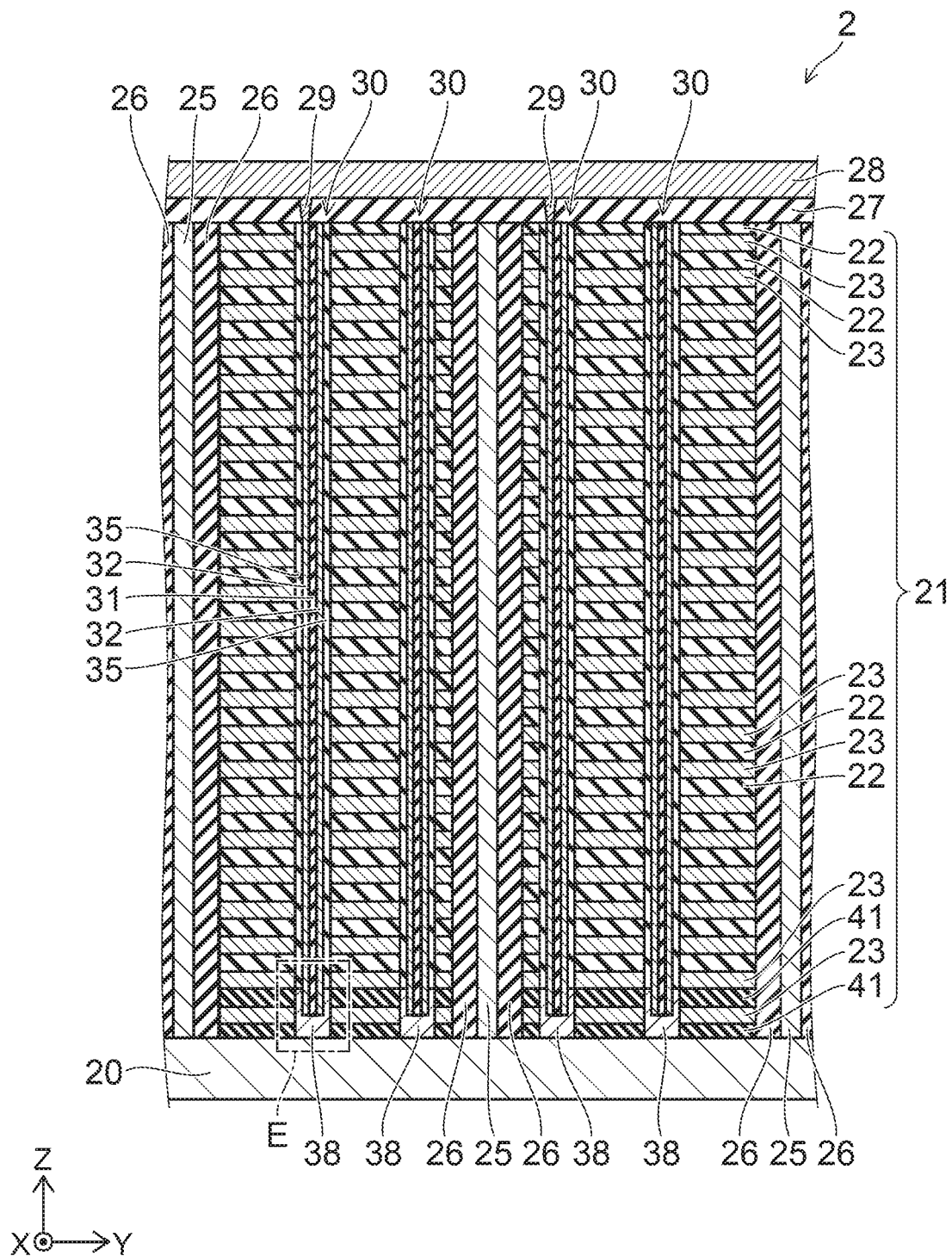
FIG. 6 is a cross-sectional view showing a semiconductor memory device according to a second embodiment.

FIG. 6 is a cross-sectional view showing a semiconductor memory device according to the embodiment.

Figure 7:
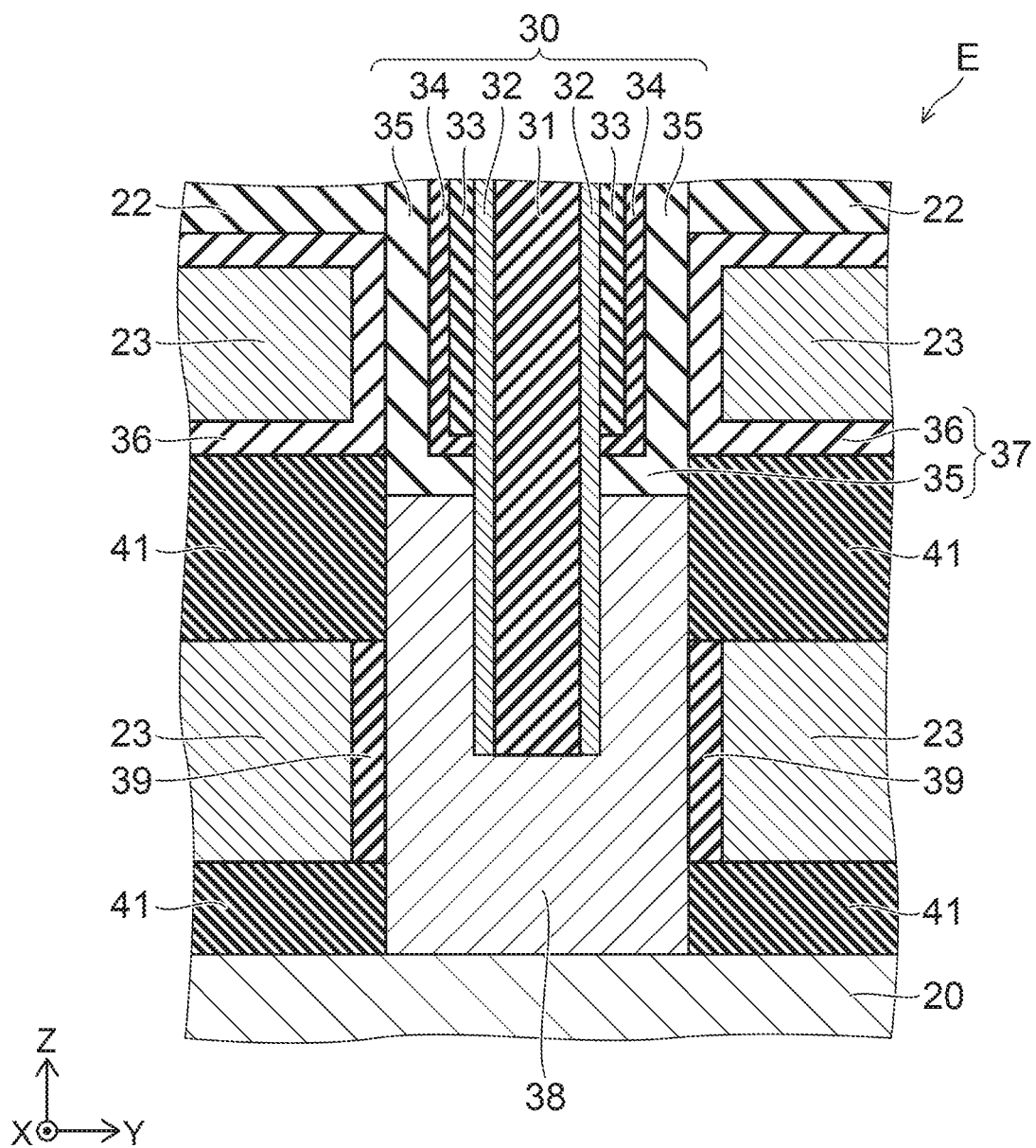
FIG. 7 is a cross-sectional view corresponding to region E of FIG. 6.

FIG. 7 is a cross-sectional view corresponding to region E of FIG. 6.

In the stacked body 21 of the semiconductor memory device 2 according to the embodiment as shown in FIG. 6 and FIG. 7, among the spaces between the electrode films 23, the fixed charge retaining films 41 are provided in only the spaces of the two layers from the bottom; and insulating films 22 are provided in the other spaces between the electrode films 23. For example, the insulating films 22 are formed of an insulating material such as silicon oxide, etc. In other words, the fixed charge retaining films 41 and the electrode films 23 are stacked alternately in the lower portion of the stacked body 21; and the insulating films 22 and the electrode films 23 are stacked alternately in the middle portion and the upper portion of the stacked body 21. In other words, among the fixed charge retaining films 41 and the insulating films 22 included in the stacked body 21, the concentration of the fixed charge retaining material in the fixed charge retaining films 41 most proximal to the silicon substrate 20 is higher than the concentration of the fixed charge retaining material in the insulating films 22 most distal to the silicon substrate 20.

Otherwise, the configuration of the embodiment is similar to that of the first embodiment described above.

According to the embodiment, the neutral threshold of the lower select gate transistor can be adjusted by providing the fixed charge retaining films 41 above and below the electrode film 23 of the lowermost level functioning as the lower select gate line. Thereby, the leakage current that flows in the silicon pillar 32 and the silicon member 38 when the lower select gate transistor is in the OFF state can be reduced.

Third Embodiment

A third embodiment will now be described.

Figure 8:
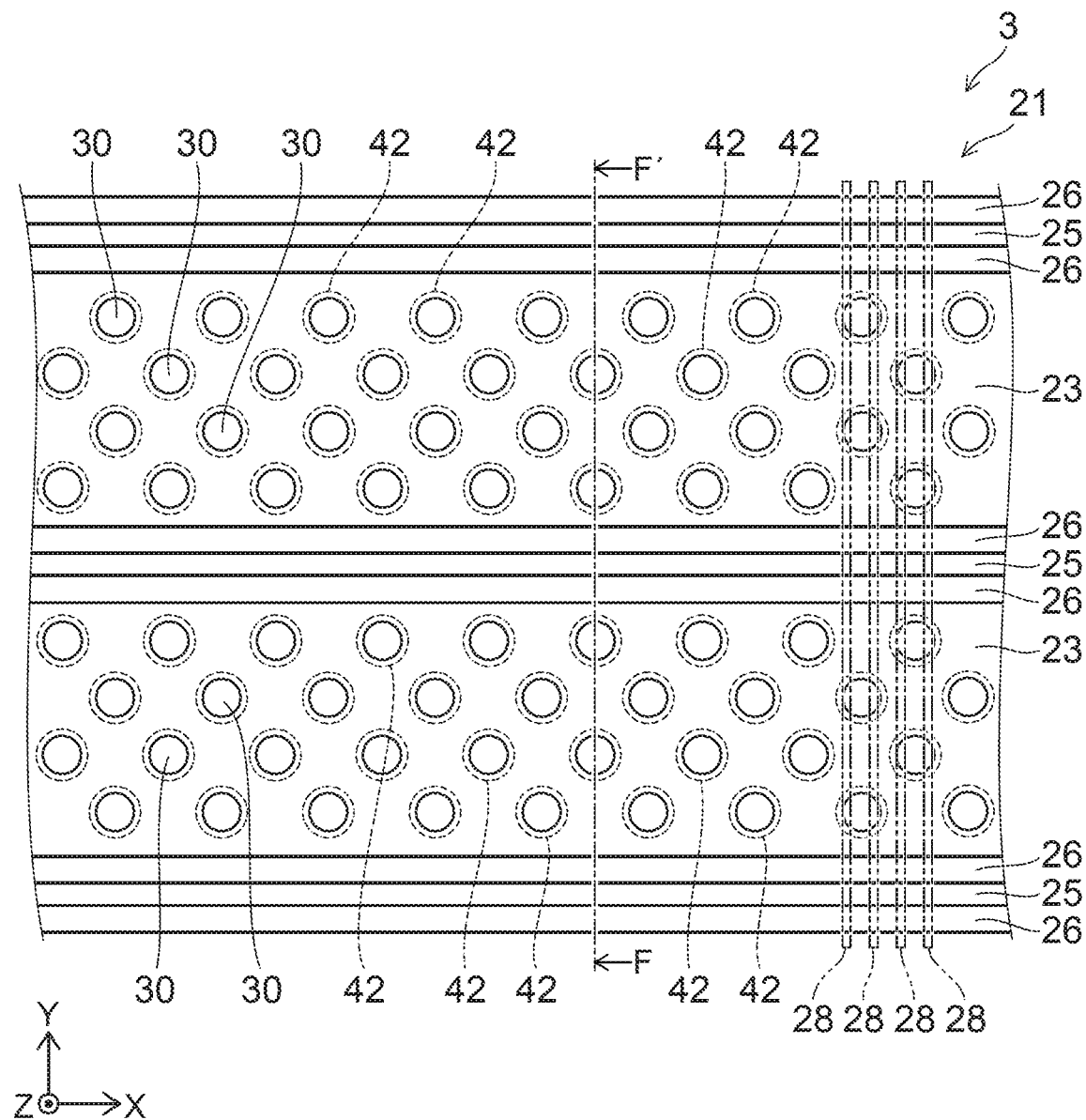
FIG. 8 is a plan view showing a semiconductor memory device according to a third embodiment.

FIG. 8 is a plan view showing a semiconductor memory device according to the embodiment.

Figure 9:
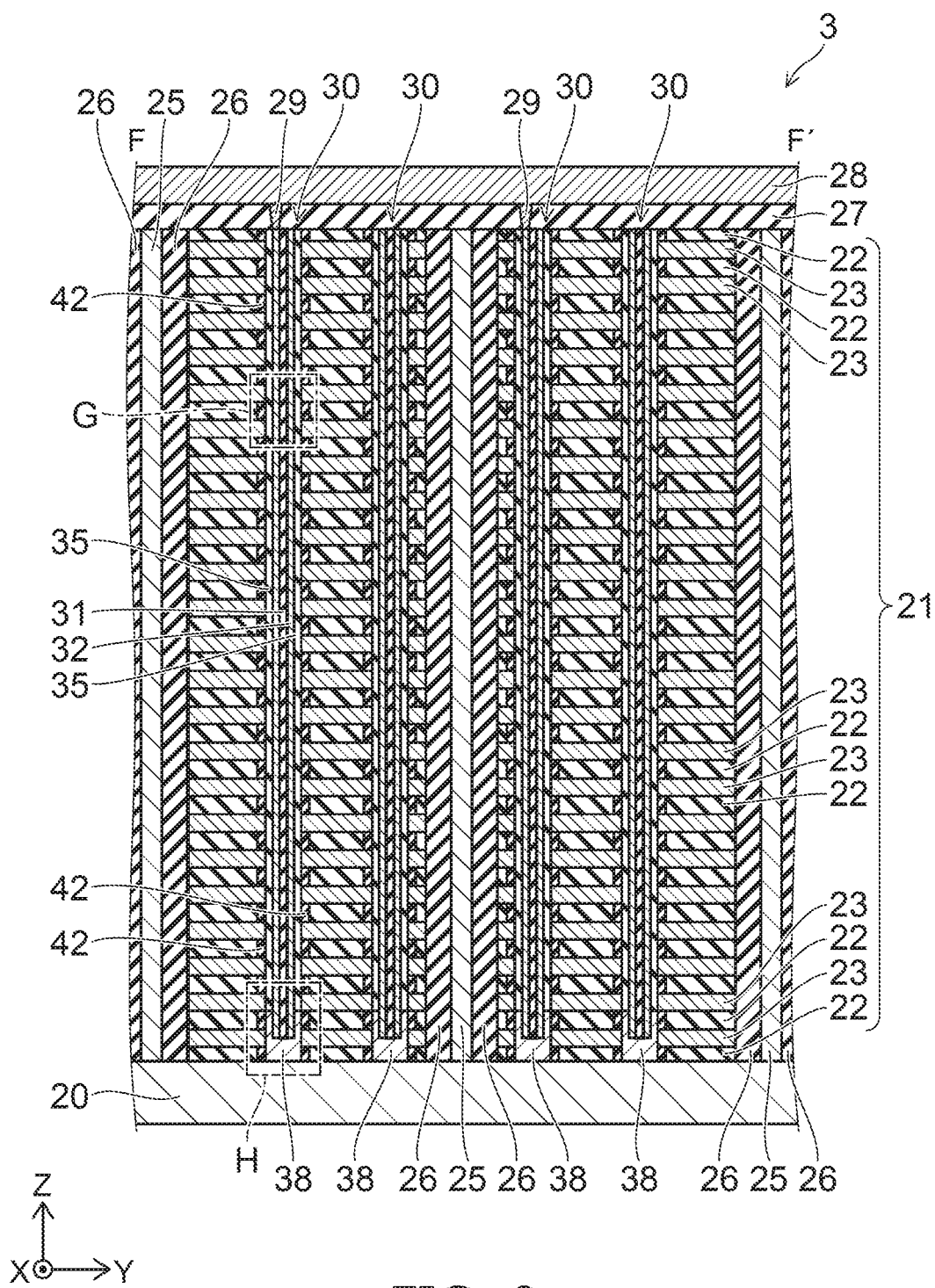
FIG. 9 is a cross-sectional view along line F-F' shown in FIG. 8.

FIG. 9 is a cross-sectional view along line F-F' shown in FIG. 8.

Figure 10:
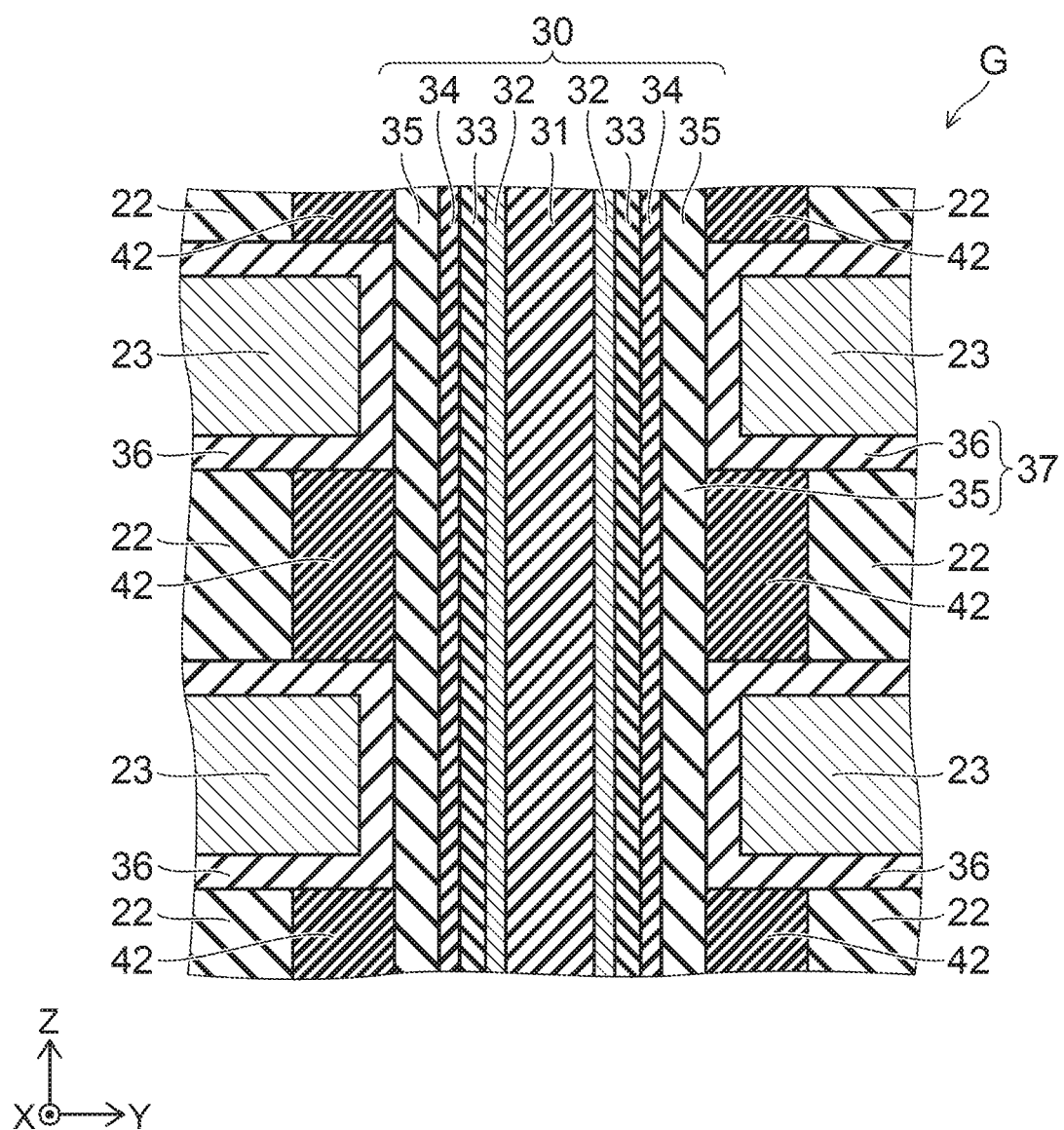
FIG. 10 is a cross-sectional view corresponding to region G of FIG. 9.

FIG. 10 is a cross-sectional view corresponding to region G of FIG. 9.

Figure 11:
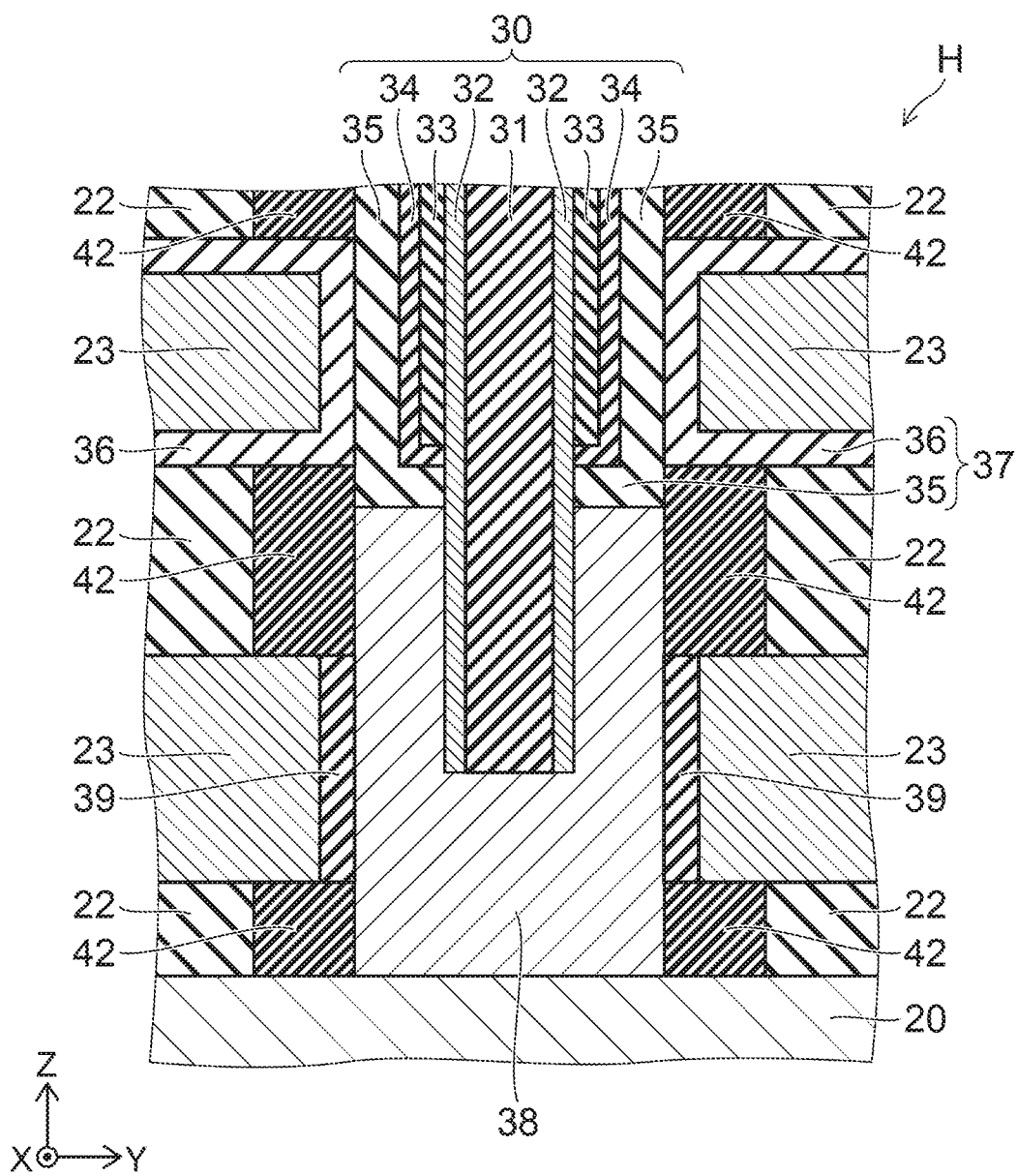
FIG. 11 is a cross-sectional view corresponding to region H of FIG. 9.

FIG. 11 is a cross-sectional view corresponding to region H of FIG. 9.

As shown in FIG. 8 to FIG. 11, the semiconductor memory device 3 according to the embodiment differs from the semiconductor memory device 1 according to the first embodiment described above (referring to FIG. 1 to FIG. 5) in that the insulating films 22 are provided instead of the fixed charge retaining films 41 (referring to FIG. 4); and fixed charge retaining members 42 are provided between the columnar member 30 and the insulating films 22.

In other words, the insulating films 22 and the electrode films 23 are stacked alternately in the stacked body 21. For example, the insulating films 22 are formed of an insulating material such as silicon oxide, etc. The fixed charge retaining members 42 include a fixed charge retaining material shown in Table 1. The configurations of the fixed charge retaining members 42 are circular ring configurations surrounding the columnar member 30. The multiple fixed charge retaining members 42 are arranged to be separated from each other along each of the columnar members 30. The fixed charge retaining members 42 contact the silicon oxide film 35 of the columnar member 30.

The fixed charge retaining members 42 can be formed by forming the stacked body 21 by alternately depositing the insulating films 22 and silicon nitride films (not illustrated) on the silicon substrate 20, forming the memory holes in the stacked body 21, and subsequently performing ion implantation of the fixed charge retaining material into the inner surfaces of the memory holes. Subsequently, the columnar member 30 is formed inside the memory holes; and the silicon nitride films are replaced with the electrode films 23.

According to the embodiment, the interference of the memory cell transistors can be controlled efficiently by disposing the fixed charge retaining members 42 at the vicinity of the columnar member 30. Also, the current that flows in the silicon pillar 32 and the silicon member 38 can be increased by setting the portions of the silicon pillar 32 and the silicon member 38 surrounded with the fixed charge retaining members 42 to the ON state.

Otherwise, the configuration and the effects of the embodiment are similar to those of the first embodiment described above.

Fourth Embodiment

A fourth embodiment will now be described.

Figure 12:
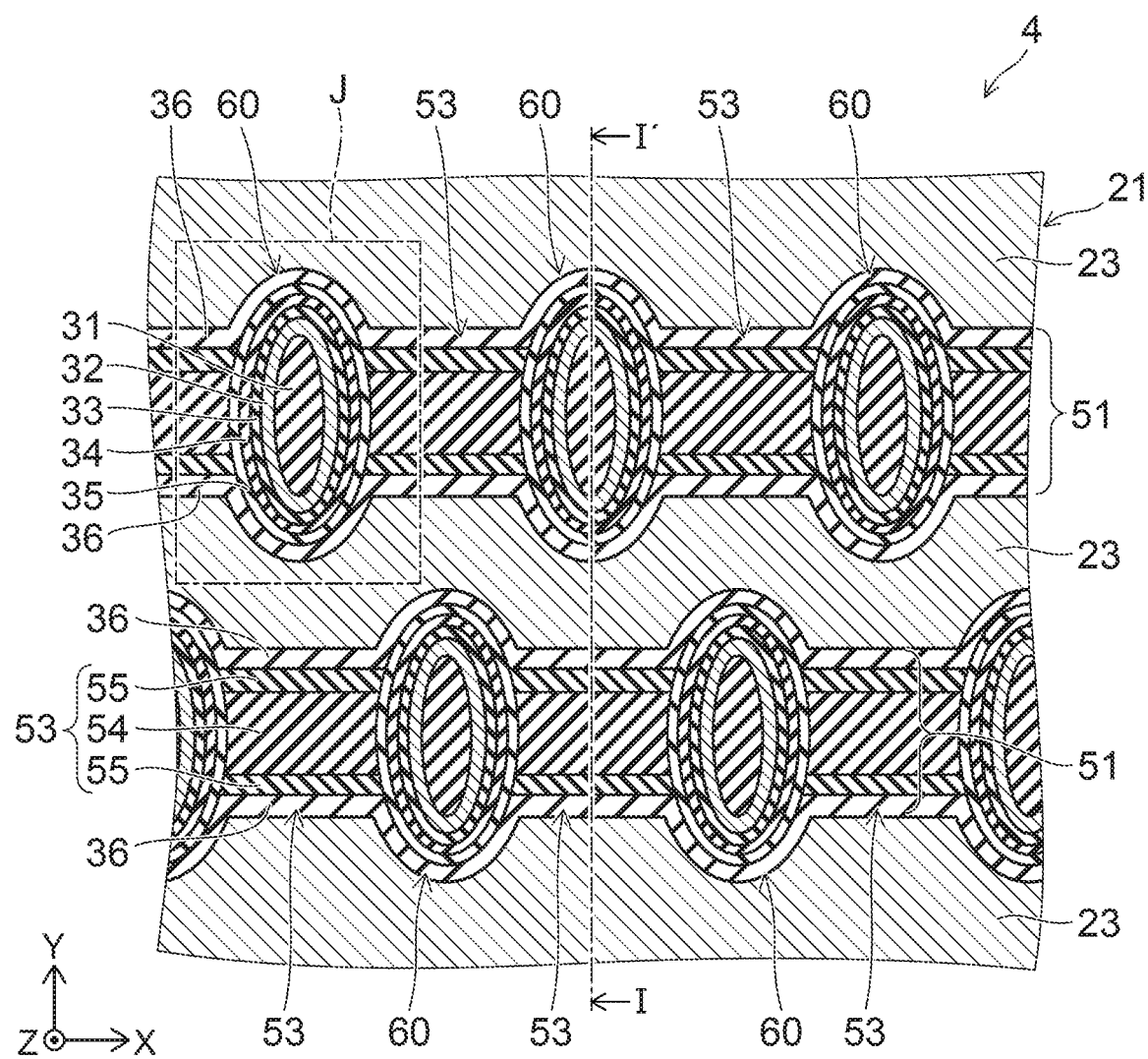
FIG. 12 is a cross-sectional view showing a semiconductor memory device according to a fourth embodiment.

FIG. 12 is a cross-sectional view showing a semiconductor memory device according to the embodiment.

Figure 13:
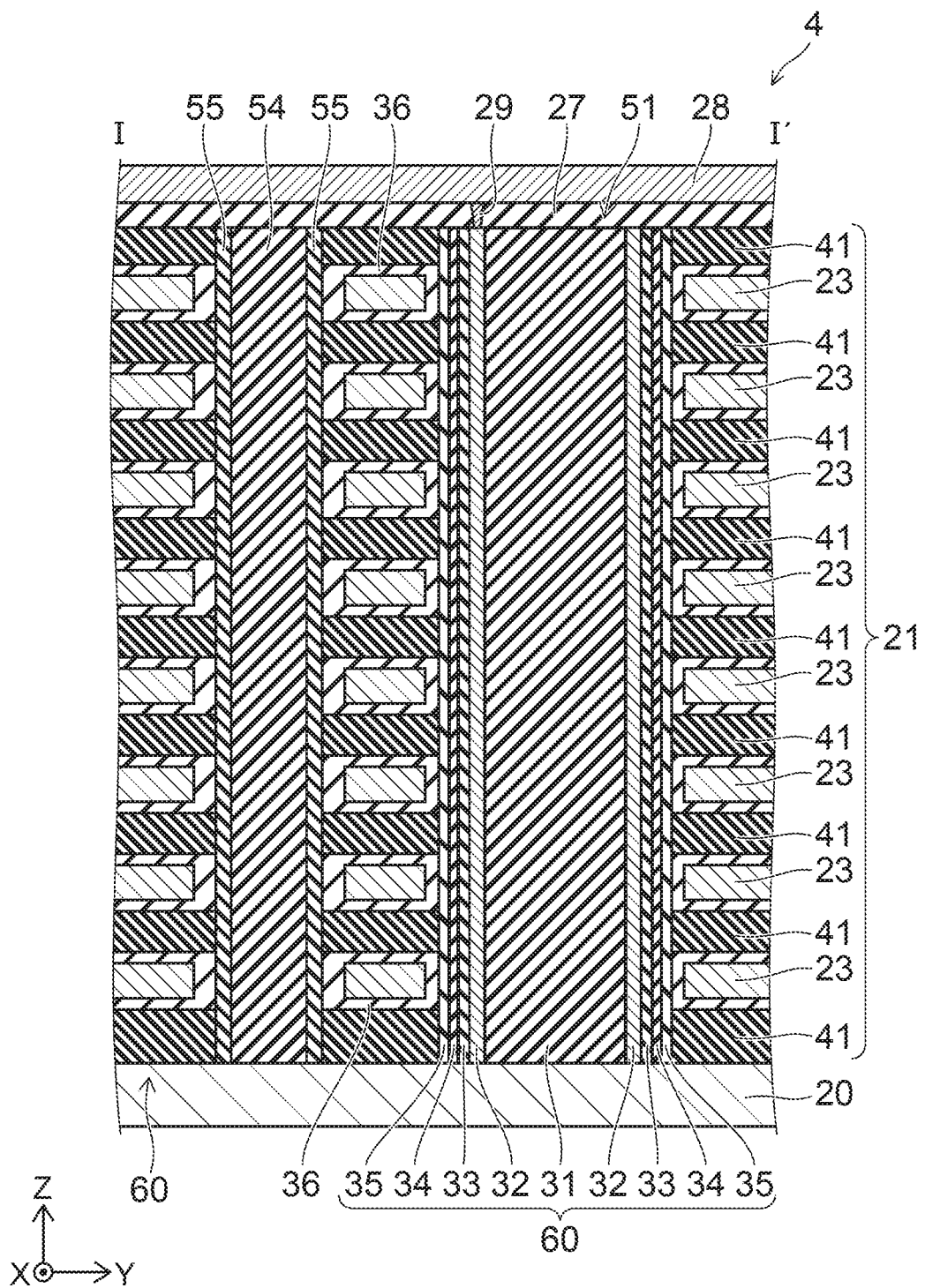
FIG. 13 is a cross-sectional view along line I-I' shown in FIG. 12.

FIG. 13 is a cross-sectional view along line I-I' shown in FIG. 12.

Figure 14:
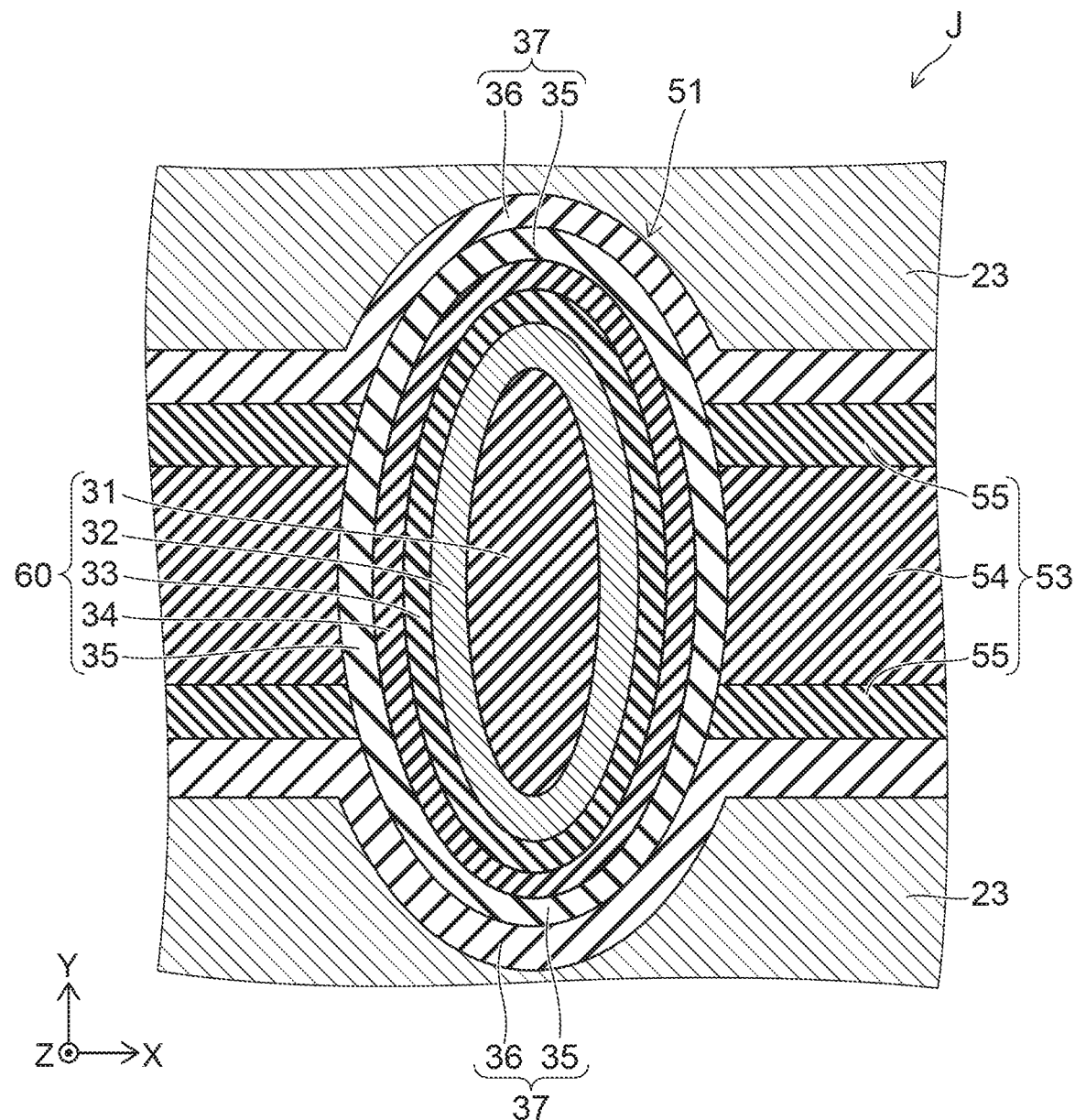
FIG. 14 is a cross-sectional view showing region J of FIG. 12.

FIG. 14 is a cross-sectional view showing region J of FIG. 12.

As shown in FIG. 12 and FIG. 13, the stacked body 21 is provided on the silicon substrate 20 in the semiconductor memory device 4 according to the embodiment. In the stacked body 21, the fixed charge retaining films 41 and the electrode films 23 are stacked alternately along the Z-direction. The fixed charge retaining films 41 include at least one type of fixed charge retaining material shown in Table 1. For example, the fixed charge retaining films 41 are made from carbon-containing silicon oxide and retain a negative fixed charge. The fixed charge retaining films 41 are formed by, for example, depositing a material shown in Table 1 and by diffusing the prescribed element inside a main material made of silicon oxide, etc.

Structure bodies 51 are arranged to be separated from each other along the Y-direction inside the stacked body 21. The configurations of the structure bodies 51 are substantially plate configurations spreading along the XZ plane. Accordingly, the fixed charge retaining films 41 and the electrode films 23 are disposed between the mutually-adjacent structure bodies 51. The stacked body that is made of the fixed charge retaining films 41 and the electrode films 23 is disposed in each region between the structure bodies 51. In other words, the multiple electrode films 23 that are arranged to be separated from each other along the Z-direction are provided in one stacked body. When viewed from the one stacked body, an adjacent stacked body is disposed on the Y-direction side.

In the structure body 51, columnar members 60 and insulating members 53 are arranged alternately along the X-direction in contact with each other. When viewed from the Z-direction, the columnar members 60 are arranged in a staggered configuration. In other words, the positions of the columnar members 60 in the X-direction are shifted between the mutually-adjacent structure bodies 51; and the positions of the columnar members 60 in the X-direction are the same between every other structure body 51. The configurations of the columnar members 60 are, for example, substantially elliptical columns. The central axis of the columnar member 60 extends in the Z-direction; the major axis of the ellipse extends in the Y-direction; and the minor axis of the ellipse extends in the X-direction. The configuration of the insulating member 53 is a substantially quadrilateral column having a central axis extending in the Z-direction. The major diameter, i.e., the length in the Y-direction, of the columnar member 60 is longer than the length in the Y-direction of the insulating member 53.

As shown in FIG. 14, the film configuration of the columnar member 60 is similar to the film configuration of the columnar member 30 of the first embodiment (referring to FIG. 3 and FIG. 4). In other words, in the columnar member 60, a substantially elliptical columnar core member 31 is provided; and the silicon pillar 32, the tunneling insulating film 33, the charge storage film 34, and the silicon oxide film 35 are provided in this order from the core member 31 side toward the outer side at the periphery of the core member 31. The compositions of the core member 31, the silicon pillar 32, the tunneling insulating film 33, the charge storage film 34, and the silicon oxide film 35 are similar to those of the first embodiment. In the semiconductor memory device 4 according to the embodiment, the silicon member 38 (referring to FIG. 2 and FIG. 5) is not provided; and the columnar member 60 contacts the silicon substrate 20. Thereby, the silicon pillar 32 is connected to the silicon substrate 20.

In the insulating member 53, an insulating member 54 is provided; and insulating films 55 are provided on the side surfaces of the insulating member 54 facing the two Y-direction sides. The insulating member 54 is made from an insulating material and is made of, for example, silicon oxide. The insulating films 55 also are made from an insulating material and are made of, for example, silicon oxide.

The high dielectric constant films 36 are provided on the side surfaces facing the two Y-direction sides of the structure body made of the columnar member 60 and the insulating member 53. The composition and the arrangement position of the high dielectric constant film 36 are similar to those of the first embodiment. The blocking insulating film 37 includes the silicon oxide film 35 and the high dielectric constant film 36. The blocking insulating film 37 is provided at least between the charge storage film 34 and the electrode films 23.

In the embodiment as well, a memory cell transistor that has the silicon pillar 32 as a channel and the electrode film 23 as a gate is formed at each crossing portion between the silicon pillars 32 and the electrode films 23. When viewed from the silicon pillar 32, the electrode films 23 are provided on the two Y-direction sides and can be set to mutually-independent potentials; therefore, a memory cell transistor is formed for each electrode film 23. For example, two memory cell transistors that are arranged in the Y-direction are formed in the cross section shown in FIG. 14.

According to the embodiment, the arrangement density of the memory cell transistors can be increased compared to the first embodiment described above.

In the embodiment as well, similarly to the first embodiment described above, the operations of the memory cell transistors can be stabilized by a fixed charge being retained by the fixed charge retaining films 41.

Otherwise, the configuration and the effects of the embodiment are similar to those of the first embodiment described above.

Fifth Embodiment

A fifth embodiment will now be described.

Figure 15:
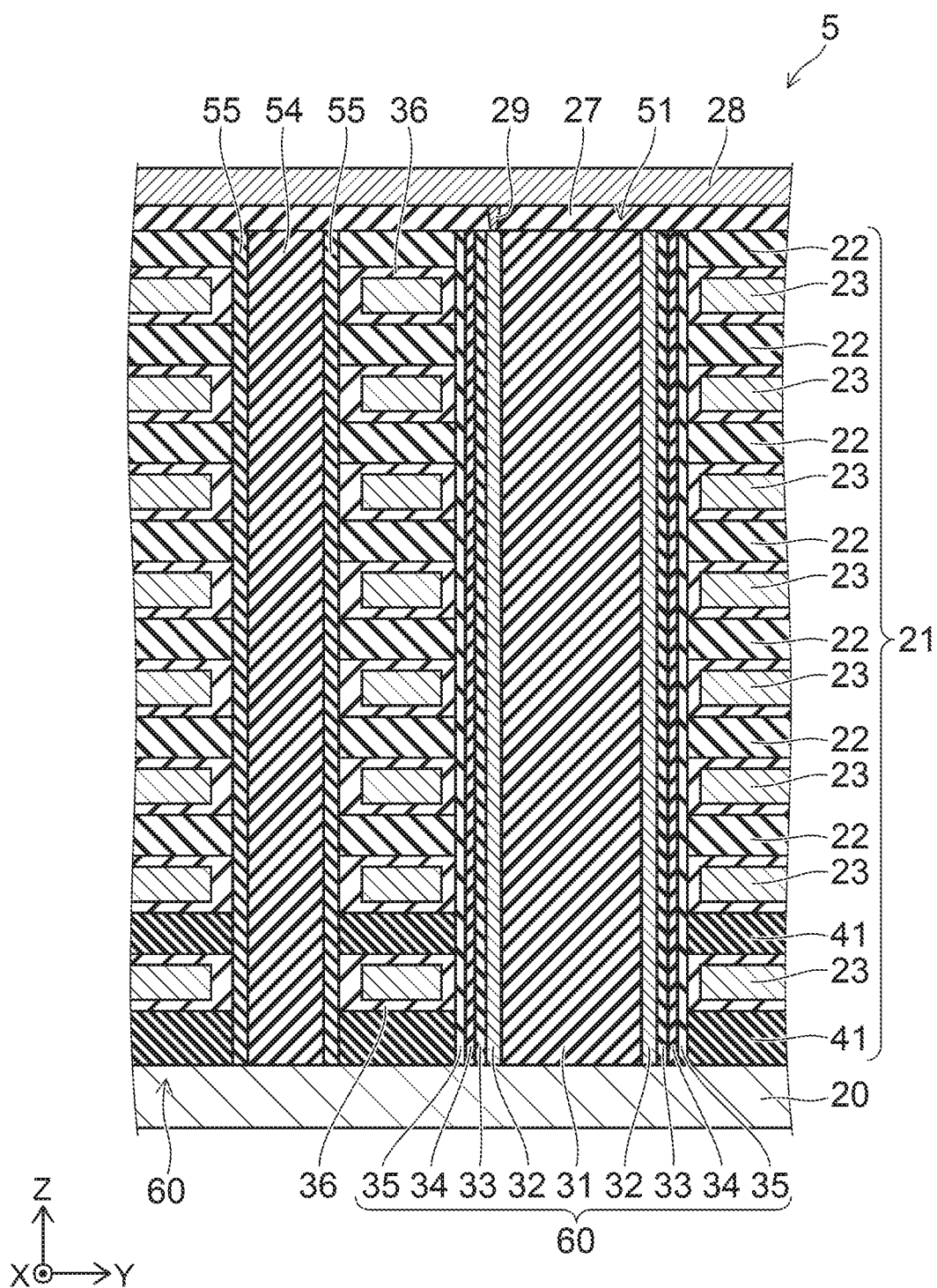
FIG. 15 is a cross-sectional view showing a semiconductor memory device according to a fifth embodiment.

FIG. 15 is a cross-sectional view showing a semiconductor memory device according to the embodiment.

The embodiment is an example in which the second embodiment and the fourth embodiment described above are combined.

As shown in FIG. 15, the semiconductor memory device 5 according to the embodiment differs from the semiconductor memory device 4 according to the fourth embodiment described above (referring to FIG. 12 to FIG. 14) in that the fixed charge retaining films 41 are provided in only the lower portion of the stacked body 21; and the insulating films 22 are provided instead of the fixed charge retaining films 41 in the portion of the stacked body 21 other than the lower portion. For example, the fixed charge retaining films 41 are provided in only the two levels from the bottom. In other words, among the fixed charge retaining films 41 and the insulating films 22 included in the stacked body 21, the concentration of the fixed charge retaining material in the fixed charge retaining films 41 most proximal to the silicon substrate 20 is higher than the concentration of the fixed charge retaining material in the insulating films 22 most distal to the silicon substrate 20.

According to the embodiment, the neutral threshold of the lower select gate transistor can be adjusted by providing the fixed charge retaining films 41 above and below the electrode film 23 of the lowermost level functioning as the lower select gate line. Thereby, the leakage current that flows through the silicon pillar 32 when the lower select gate transistor is in the OFF state can be reduced.

Otherwise, the configuration and the effects of the embodiment are similar to those of the fourth embodiment described above.

Sixth Embodiment

A sixth embodiment will now be described.

Figure 16:
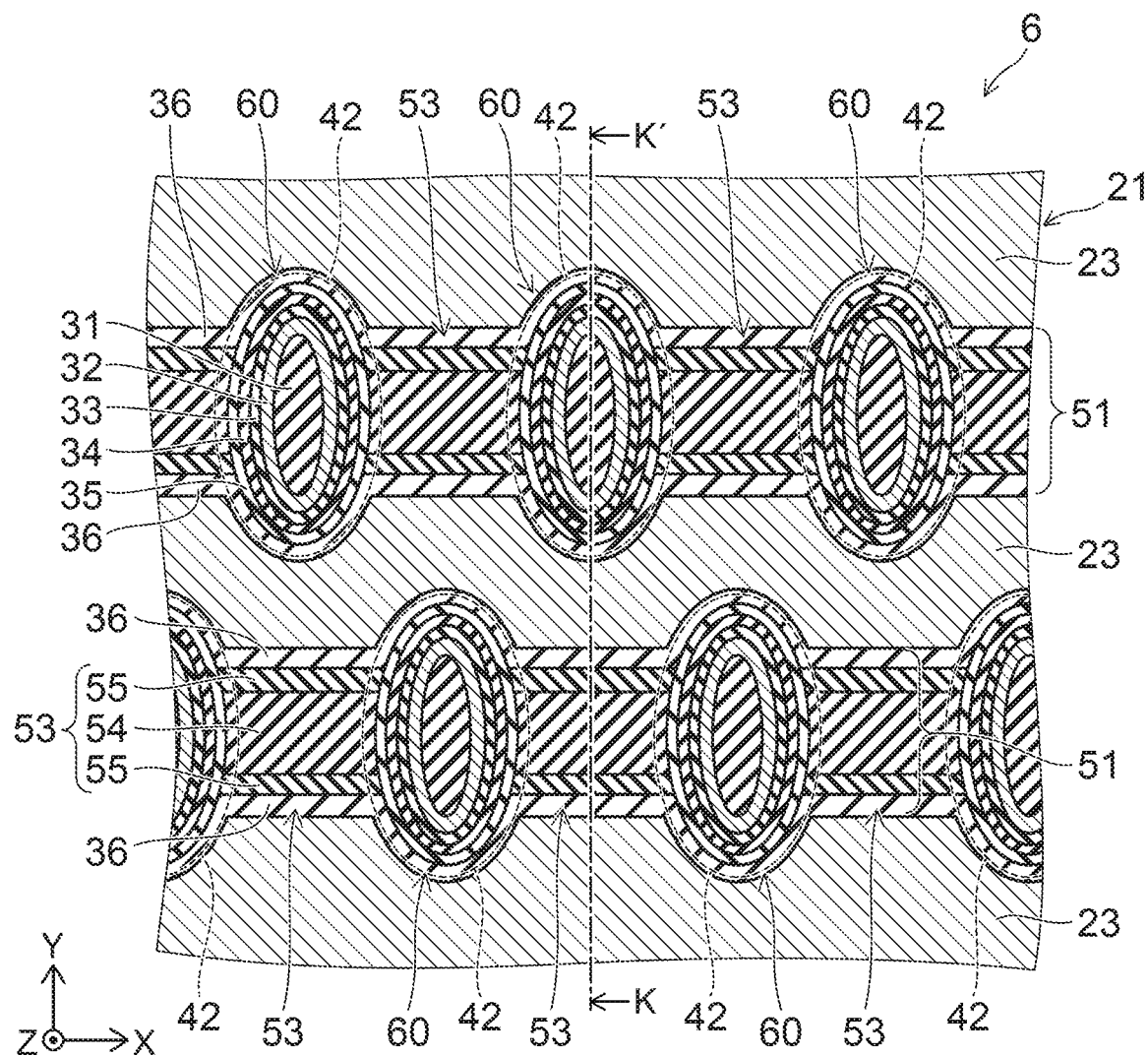
FIG. 16 is a plan view showing a semiconductor memory device according to a sixth embodiment.

FIG. 16 is a plan view showing a semiconductor memory device according to the embodiment.

Figure 17:
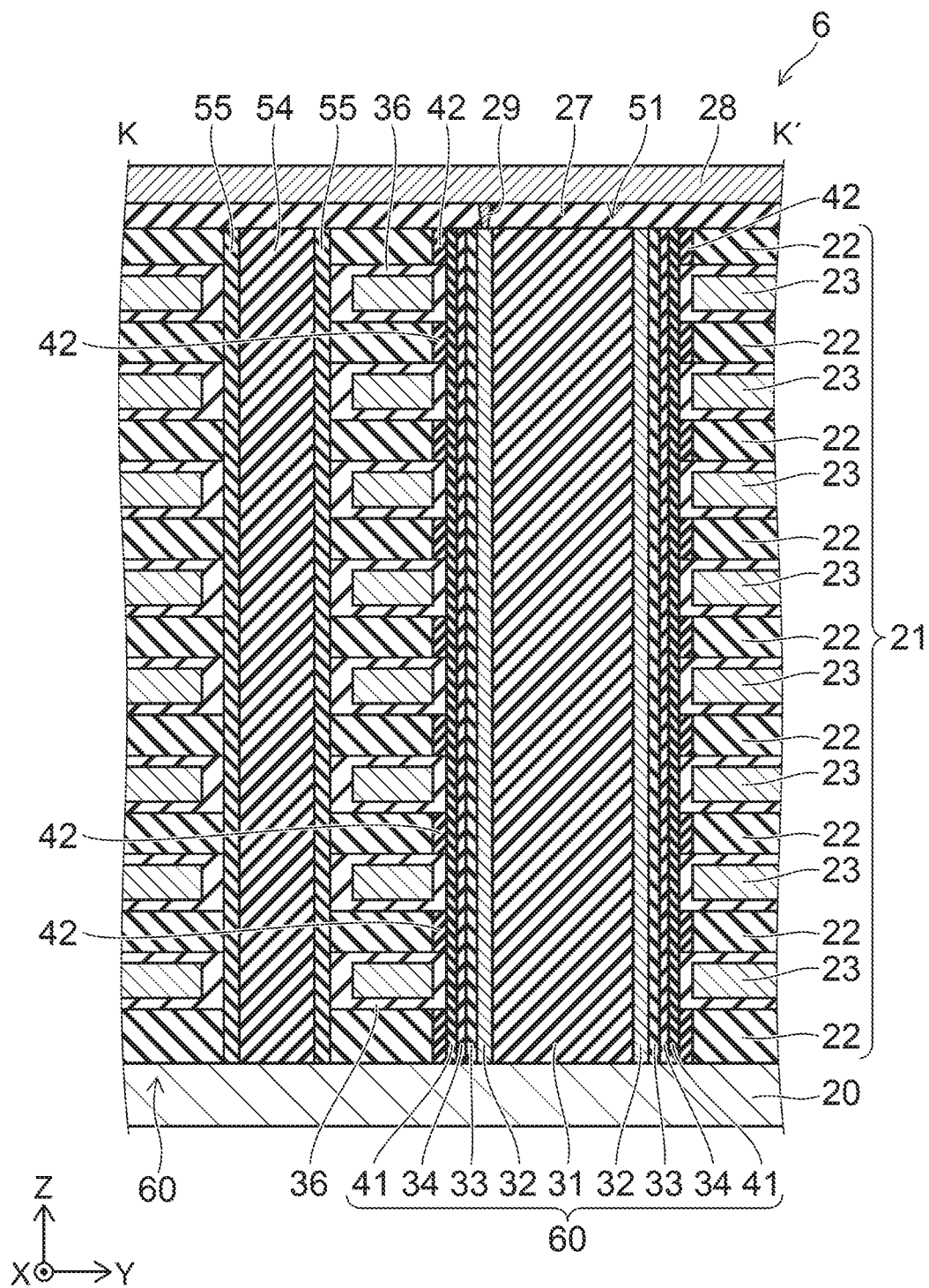
FIG. 17 is a cross-sectional view along line K-K' shown in FIG. 16.

FIG. 17 is a cross-sectional view along line K-K' shown in FIG. 16.

The embodiment is an example in which the third embodiment and the fourth embodiment described above are combined.

As shown in FIG. 16 and FIG. 17, the semiconductor memory device 6 according to the embodiment differs from the semiconductor memory device 4 according to the fourth embodiment described above (referring to FIG. 12 to FIG. 14) in that the insulating films 22 are provided instead of the fixed charge retaining films 41 (referring to FIG. 13); and the fixed charge retaining members 42 are provided between the columnar member 60 and the insulating films 22.

In other words, the insulating films 22 and the electrode films 23 are stacked alternately in the stacked body 21. The fixed charge retaining members 42 include a fixed charge retaining material shown in Table 1. The configurations of the fixed charge retaining members 42 are elliptical ring configurations surrounding the columnar member 60. The multiple fixed charge retaining members 42 are arranged to be separated from each other along each of the columnar members 60. The fixed charge retaining members 42 contact the silicon oxide film 35 of the columnar member 60.

According to the embodiment, the interference of the memory cell transistors can be controlled efficiently by disposing the fixed charge retaining members 42 at the vicinity of the columnar member 60. Also, the current that flows in the silicon pillar 32 can be increased.

Otherwise, the configuration and the effects of the embodiment are similar to those of the fourth embodiment described above.

According to the embodiments described above, a semiconductor memory device can be realized in which the stability of the operations is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Additionally, the embodiments described above can be combined mutually.

What is claimed is:

1. A semiconductor memory device, comprising:
   a plurality of electrode films and a plurality of first insulating films stacked alternately along a first direction;
   a semiconductor member extending in the first direction;
   a charge storage member provided between the semiconductor member and the electrode films;
   a second insulating film provided between the charge storage member and the electrode films;

a substrate, wherein among the plurality of first insulating films, a concentration of the first material in the first insulating film most proximal to the substrate being higher than a concentration of the first material in the first insulating film most distal to the substrate, at least one of the plurality of first insulating films including one or more types of a first material selected from the group consisting of silicon nitride, hafnium oxide, silicon oxynitride, and aluminum oxide.

2. The device according to claim 1, wherein all of the plurality of first insulating films include the first material.

3. The device according to claim 1, wherein
at least one of the plurality of first insulating films includes:
 a first portion made of an insulating material different from the first material; and
 a second portion including the first material, surrounding the semiconductor member, and being provided between the first portion and the second insulating film.

4. The device according to claim 1, wherein
the second insulating film includes:
 a first film including silicon oxide; and
 a second film provided between the first film and the electrode films, a relative dielectric constant of the second film being higher than a relative dielectric constant of silicon oxide.

5. The device according to claim 4, wherein
a configuration of the first film is a tubular configuration surrounding the semiconductor member, and
the second film is provided also on upper surfaces of the electrode films and on lower surfaces of the electrode films.

6. The device according to claim 4, wherein the second film includes hafnium oxide or aluminum oxide.

7. The device according to claim 1, wherein the semiconductor member pierces at least one of the plurality of electrode films.

8. The device according to claim 1, further comprising a plurality of other electrode films arranged to be separated from each other along the first direction,
the semiconductor member being disposed between the plurality of electrode films and the plurality of other electrode films.

9. A semiconductor memory device, comprising:
a substrate;
a plurality of electrode films and a plurality of first insulating films stacked alternately along a first direction;
a semiconductor member extending in the first direction;
a charge storage member provided between the semiconductor member and the electrode films; and
a second insulating film provided between the charge storage member and the electrode films,
among the plurality of first insulating films, the first insulating film most proximal to the substrate including one or more types of a first material selected from the group consisting of carbon-containing silicon oxide, silicon nitride, hafnium oxide, silicon oxynitride, and aluminum oxide,
a concentration of the first material in the first insulating film most proximal to the substrate being higher than a concentration of the first material in the first insulating film most distal to the substrate.

10. The device according to claim 9, wherein
the second insulating film includes:
 a first film including silicon oxide; and
 a second film provided between the first film and the electrode films, a relative dielectric constant of the second film being higher than a relative dielectric constant of silicon oxide.

11. The device according to claim 10, wherein
a configuration of the first film is a tubular configuration surrounding the semiconductor member, and
the second film is provided also on upper surfaces of the electrode films and on lower surfaces of the electrode films.

12. The device according to claim 10, wherein the second film includes hafnium oxide or aluminum oxide.

13. The device according to claim 9, wherein the semiconductor member pierces at least one of the plurality of electrode films.

14. The device according to claim 9, further comprising a plurality of other electrode films arranged to be separated from each other along the first direction,
the semiconductor member being disposed between the plurality of electrode films and the plurality of other electrode films.

15. A semiconductor memory device, comprising:
a plurality of electrode films and a plurality of first insulating films stacked alternately along a first direction;
a semiconductor member extending in the first direction;
a charge storage member provided between the semiconductor member and the electrode films; and
a second insulating film provided between the charge storage member and the electrode films,
at least one of the plurality of first insulating films including
 a first portion, and
 a second portion surrounding the semiconductor member, being provided between the first portion and the second insulating film, and including one or more types of a first material selected from the group consisting of carbon-containing silicon oxide, silicon nitride, hafnium oxide, silicon oxynitride, and aluminum oxide,
the first portion being made of an insulating material different from the first material,
the second portion being provided between the first portion and the semiconductor member, and
the second portion being provided between two parts of the second insulating film separated apart in the first direction.

16. The device according to claim 15, wherein
the second insulating film includes:
 a first film including silicon oxide; and
 a second film provided between the first film and the electrode films, a relative dielectric constant of the second film being higher than a relative dielectric constant of silicon oxide.

17. The device according to claim 16, wherein
a configuration of the first film is a tubular configuration surrounding the semiconductor member, and
the second film is provided also on upper surfaces of the electrode films and on lower surfaces of the electrode films.

18. The device according to claim 15, wherein the semiconductor member pierces at least one of the plurality of electrode films.

19. The device according to claim 15, further comprising a plurality of other electrode films arranged to be separated from each other along the first direction, the semiconductor member being disposed between the plurality of electrode films and the plurality of other electrode films.

* * * * *